US 6,683,805 B2

(12) United States Patent
Joshi et al.

(10) Patent No.: US 6,683,805 B2
(45) Date of Patent: Jan. 27, 2004

(54) SUPPRESSION OF LEAKAGE CURRENTS IN VLSI LOGIC AND MEMORY CIRCUITS

(75) Inventors: Rajiv V. Joshi, Yorktown Heights, NY (US); Louis L. Hsu, Fish Kill, NY (US); Azeez J. Bhavnagarwala, Danbury, CT (US)

(73) Assignee: IBM Corporation, Armonk, NY (US)

( * ) Notice: Subject to any disclaimer, the term of this patent is extended or adjusted under 35 U.S.C. 154(b) by 29 days.

(21) Appl. No.: 10/067,411

(22) Filed: Feb. 5, 2002

(65) Prior Publication Data

US 2003/0147272 A1 Aug. 7, 2003

(51) Int. Cl.[7] .................................. G11C 11/413
(52) U.S. Cl. ............................. 365/156; 365/227
(58) Field of Search .......................... 365/156, 226, 365/227

(56) References Cited

U.S. PATENT DOCUMENTS 4,932,002 A * 6/1990 Houston ............... 365/241
5,604,705 A * 2/1997 Ackland et al. ........ 365/205
5,963,490 A * 10/1999 Kawamura ............ 365/201
6,031,775 A * 2/2000 Chang et al. .......... 365/205
6,205,071 B1 * 3/2001 Ooishi .................. 365/207

OTHER PUBLICATIONS

"Effects of Gate–to–Body Tunneling Current on PD/SOI CMOS SRAM", R.V. Joshi, et. al., IBM SRDC, Hopewell Junction, NY 12533, pp 1–2.
"Suppression of Leakage Currents in PD/SOI Technology", R.V. Joshi, et al., IBM Microelectronic Div., East Fishkill, New York 12553, pps. 1–5.

* cited by examiner

Primary Examiner—Richard Elms
Assistant Examiner—Jung H. Hur
(74) Attorney, Agent, or Firm—Dilworth & Barrese LLP

(57) ABSTRACT

An SRAM system is provided having an array of SRAM cells including at least one circuit receiving a first power voltage and a power control circuit for supplying a second power voltage to at least one selected circuit of the at least one circuit. The system is one of a memory array and a logic system, and a circuit of the at least one circuit is one of a memory cell of the memory array, a sense amplifier of the memory array and a path of the logic system. A method is also provided for providing a power supply voltage to at least one circuit of a system.

30 Claims, 9 Drawing Sheets

**Worst Case Read Pattern
Read Access Time**

Worst Case Read Pattern

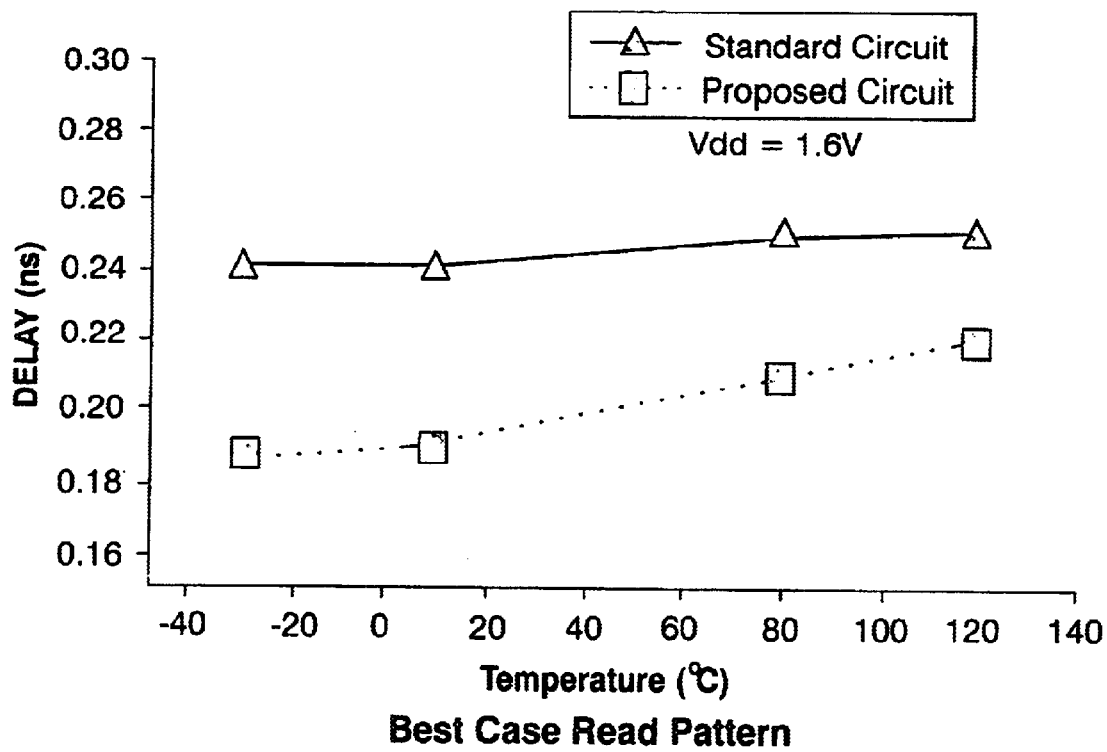
Fig. 6 Best Case Read Pattern
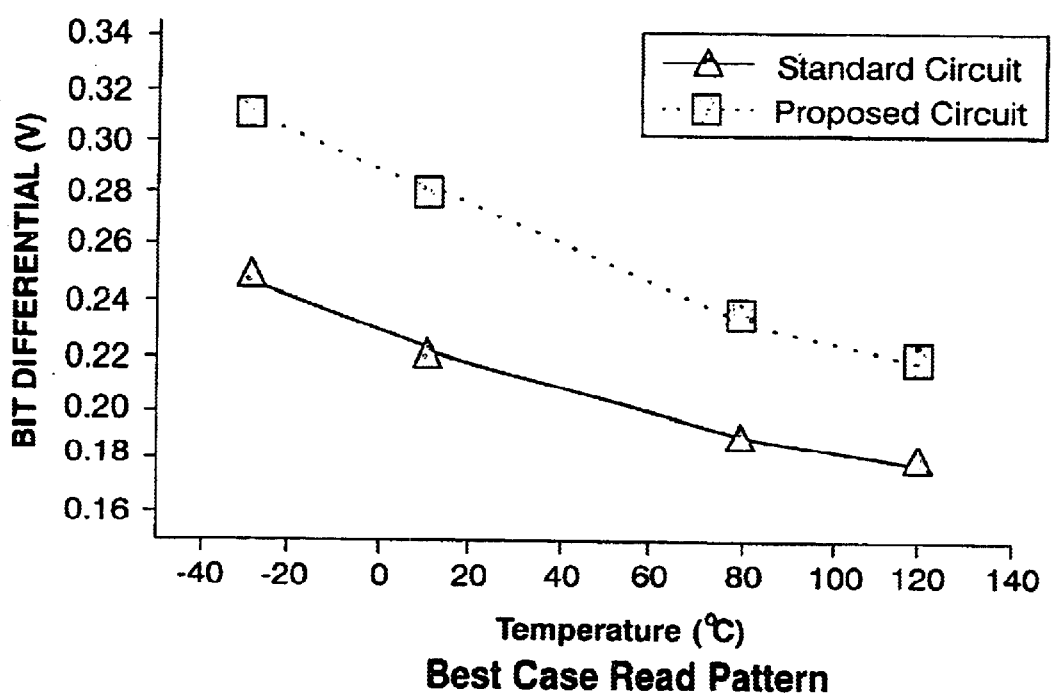
Fig. 7 Best Case Read Pattern

Sense Amplifier

SUPPRESSION OF LEAKAGE CURRENTS IN VLSI LOGIC AND MEMORY CIRCUITS

FIELD OF THE INVENTION

This invention relates to VLSI logic and memory circuits. Specifically, it relates to suppression of effects of leakage current in selected logic paths of logic circuits and selected SRAM cells and sense amplifiers of memory circuits.

BACKGROUND OF THE INVENTION

Leakage currents, such as standby, gate-to-body and bipolar leakage, in VLSI memory and logic circuits negatively affect performance and power efficiency. Excessive initial-cycle parasitic bipolar current in partially depleted (PD) Silicon-On-Insulator (SOI) circuits is known to degrade the noise margin and cause incorrect logic states, especially in pass gate logic. Recently, it has been shown that bipolar leakage current in non-selected cells on a bit column can cause degradation in read and write performance of PD SOI SRAM cells. As the technology scales, gate-to-body tunneling current through thin gate oxide layers can affect performance of PD SOI SRAM cells, especially at lower temperatures. For example, the gate-to-body tunneling current may charge and/or discharge a floating-body of a PD SOI device, and change the body voltage and threshold voltage, Vt, affecting circuit operation.

In an SRAM circuit, a sense amplifier senses bit differentials of true and complementary bitlines. Current leakage can cause degradation in sensing performance of sense amplifiers.

In a logic circuit, a critical path, which is the slowest path of the logic circuit, limits the speed of the logic circuit. The speed of the critical path limits the speed of the logic circuit. By increasing power voltage for increasing the speed of signal(s) traversing the critical path relative to other paths of the circuit, the speed of the logic circuit is increased. However, an increased power voltage may result in increased current leakage and associated negative effects.

Accordingly, a need exists for a system and method for reducing the effects of parasitic bipolar current during read operations in SRAM cells.

Furthermore, a need exists for system and method to vary power supply voltages and ground supply voltages to SRAM cells to suppress current leakage and improve the performance of the SRAM cells.

A need further exists for a system and method to vary power supply voltages to sense amplifiers for suppressing current leakage and improving performance.

In addition, a need exists for a system and method to vary pre-charge voltage levels of bitlines for suppressing current leakage and improving performance.

Finally, a need exists for a system and method to increase the speed of signal(s) traversing the critical path of a logic circuit relative to other paths of the logic circuit by increasing the power supply voltage provided to the logic gates of the critical path relative to the logic gates of the other paths of the logic circuit, while minimizing current leakage.

SUMMARY

An aspect of the present invention is to provide a system and method for reducing the effects of parasitic bipolar current during read operations in SRAM cells.

Another aspect of the present invention is to provide a system and method to vary power supply voltage and ground supply voltage to SRAM cells for suppressing current leakage and improving the performance.

A further aspect of the present invention is to provide a system and method to vary power supply voltage to sense amplifiers for suppressing current leakage and improving the performance of the SRAM cells.

An additional aspect of the present invention is to vary pre-charge voltage levels of bitlines for suppressing current leakage and improving performance.

Finally, an aspect of the present invention is to vary the power supply voltage provided to logic gates of the critical path of a logic circuit relative to the other logic gates of the logic circuit, while minimizing current leakage.

Accordingly, an SRAM system is provided and includes at least one circuit receiving a first power voltage, and a power control circuit for supplying a second power voltage to at least one selected circuit of the at least one circuit of the system. The system is one of a memory array and a logic system, the at least one circuit is one of a memory cell of the memory array, a sense amplifier of the memory array and a path of the logic system. Furthermore, a method for providing a power supply voltage to at least one circuit of a system is provided. The method includes the steps of providing a first power supply voltage to the at least one circuit of the system, and providing a second power supply voltage to at least one selected circuit of the at least one circuit. The system is one of a memory array and a logic system, a circuit of the at least one circuit is one of a memory cell of the memory array, a sense amplifier of the memory array and a path of the logic system, and the at least one selected circuit is one of a selected memory cell, a sense amplifier and a critical path of the logic system.

BRIEF DESCRIPTION OF THE DRAWINGS

FIG. 6 is a graph plotting read access time versus temperature for a standard circuit compared to the SRAM cell in accordance with the present invention, in a best case read pattern;

FIG. 7 is a graph plotting bit differentials versus temperature for a standard circuit compared to the SRAM cell in accordance with the present invention, in a best case read pattern.

DETAILED DESCRIPTION OF A PREFFERED EMBODIMENT

The present invention provides an SRAM system having a power booster and ground reducing circuit for providing variable power supply and ground supply to selected SRAM cells for suppressing parasitic bipolar effects and improving the read performance of the SRAM system.

Figure 1:
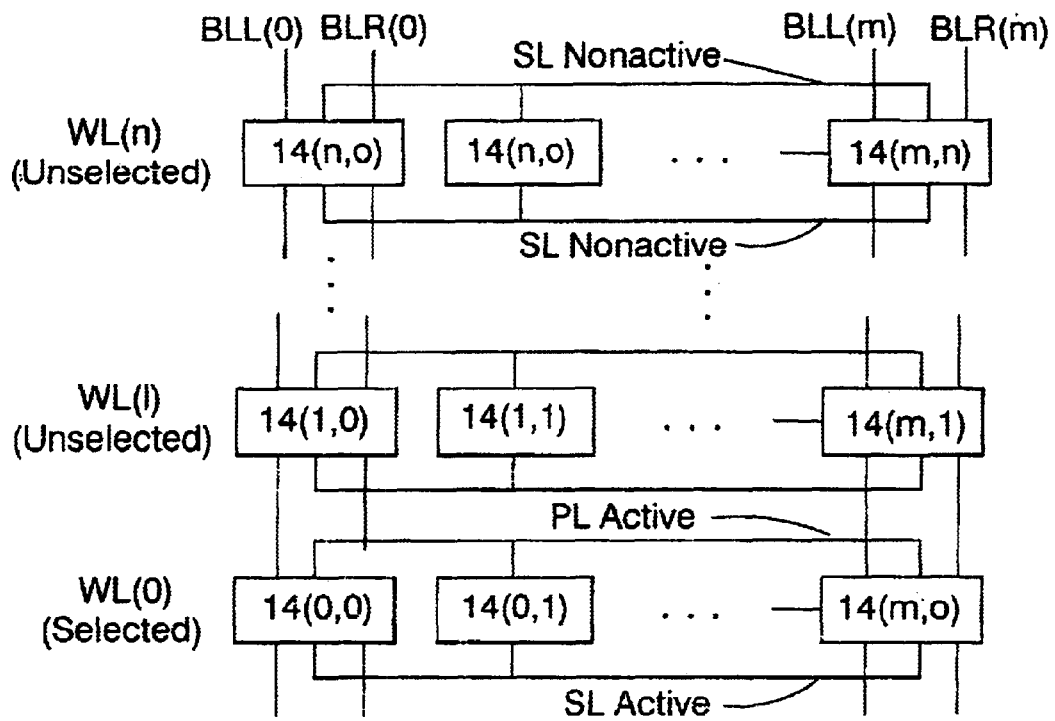
FIG. 1 is a block diagram of an SRAM system in accordance with the present invention.

FIG. 1 shows an SRAM system 10 having an SRAM array of n+1 rows and m+1 columns of SRAM cells 14(p,q), where p=0–n and q=0–m. The SRAM system includes n+1 wordlines WL(p), where p=0–n, and m+1 bitline pairs, each bitline pair having a left bitline BLL(q) and a right bitline BLR(q), where q=0–m. A powerline PL and a source line SL are shown traversing each row associated with a wordline WL(n). In FIG. 1, an example is shown in which wordline WL(0) is selected and the remaining wordlines WL(p) are unselected. For the row of cells 14(p,q) located along the row associated with the selected wordline WL(0), PL and SL are shown to be active.

Figure 2:
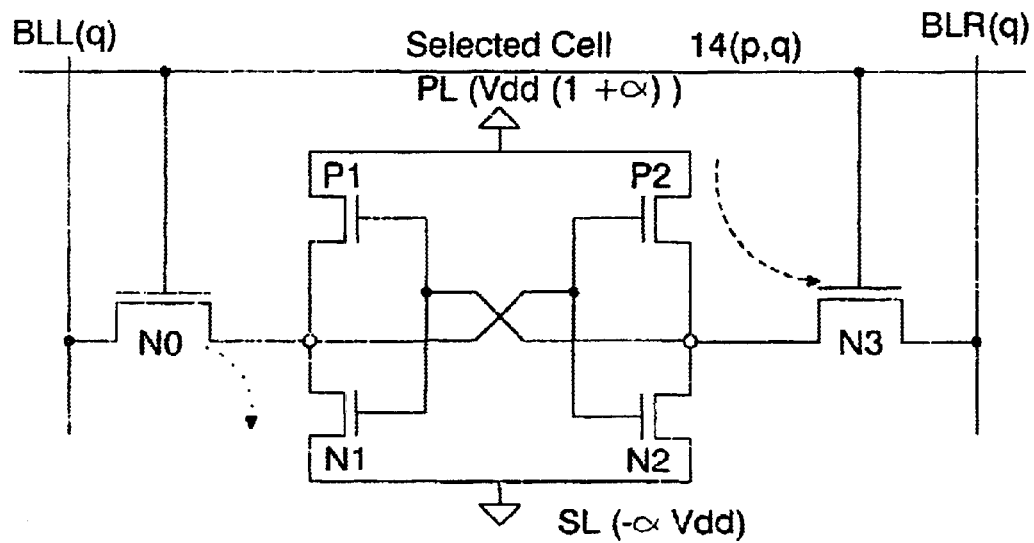
FIG. 2 is a circuit diagram of a selected SRAM cell with variable power/ground supplies in accordance with the present invention.

FIG. 2 shows an exemplary cell 14(p,q), in which the cell 14(p,q) is a 6-transistor SRAM memory cell, as is known in the art. The cell 14(p,q) shown is a selected cell located on the row associated with the selected wordline WL(0). The cell 14(p,q) includes four NFET devices, N0, N1, N2, N3 and two pFET devices P1, P2. Devices N1, P1 and N2, P2 form respective cross coupled inverter pairs, and FET devices N0, N3 are pass gate devices, as is known in the art. nFET device N1 functions as a cell storage node, also referred to as a drain node. PL is shown providing a power supply at a selected power voltage level. The exemplary selected power voltage shown is Vdd(1+α). SL is shown providing a ground supply at a selected ground voltage. The exemplary selected ground voltage shown is −αVdd. For unselected cells 14(p,q), the power supply voltage provided is a standard power voltage, such as standard Vdd, and the ground supply voltage supplied is a standard ground voltage gnd, preferably 0V.

The selected power voltage is selected to vary relative to the standard power voltage. The standard power voltage and selected power voltage may be provided by first and second power supplies, respectively. The first or second power supplies may provided by an external or an on-chip power supply and/or a combination of one or more control circuits. For example, a control circuit may include an nFET for reducing an input to the control circuit by the threshold voltage Vt of the nFET.

Similarly, the ground voltage is selected to vary relative to the standard ground voltage. The standard ground voltage and selected ground voltage may be provided by first and second ground supplies, respectively. The first or second ground supplies may provided by an external or an on-chip ground supply and/or a combination of one or more control circuits. For example, a control circuit may include an nFET for reducing an input to the control circuit by the threshold voltage Vt of the nFET.

In the preferred embodiment shown in FIG. 2, the voltages of PL and SL vary, depending upon whether or not the cell 14(p,q) is selected. In another embodiment, either of PL or SL may be fixed while the other of PL or SL varies upon selection of the cell 14(p,q).

In the example shown in FIG. 2, initially, the cell storage node N1 is at a "Low" level. In a standby state, bitlines BLL(q), BLR(q) are pre-charged to a voltage Vdd. During a read operation, the pass gate NFET device N0 and the NFET device N1 quickly pull down the bitline BLL(q). By increasing the power supply by an amount αVdd, relative to the unselected cells 14(p,q), the nFET device N1 is turned on very strongly through the pFET device P2. Furthermore, by lowering the ground supply by αVdd, relative to the unselected cells 14(p,q), the Vgs across N1 is increased, further assisting pull down of the left bitline BLL(q).

Meanwhile, pFET device P2 charges its drain node and holds the right bitline BLR(q) at a "High" level strongly through nFET device N3. Thus, the two bitlines BLL(q) and BLR(q) move in opposite directions, which is ideal for optimum performance. Furthermore, this reduces the effect of parasitic bipolar current contribution from unselected cells 14(p,q) which are in an opposite state (i.e., are at an opposite level) to that of the selected cell, and which are traversed by the same bitline as the selected cell. The leakage current from unselected cells slows down read operations. The provision of a variable power supply and ground supply, depending on whether the cell is selected or unselected, improves the read current.

During a write operation, the power and ground supplies provided to the selected cell 14(p,q) may be returned to levels Vdd and gnd, respectively. A write operation normally generates enough level differentials for sensing by sense amplifiers, and does not gate the performance of the cell.

Figure 3:
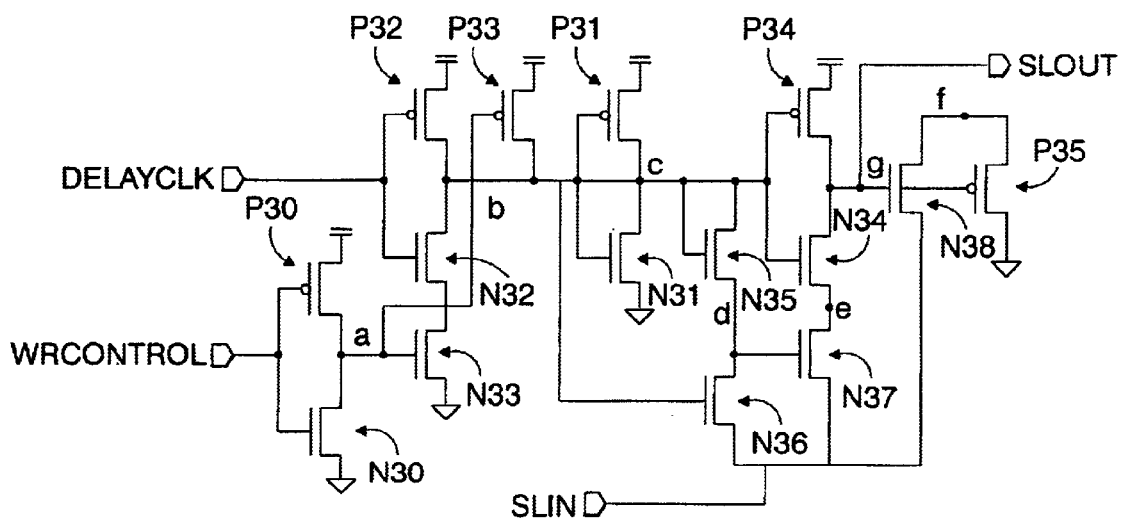
FIG. 3 is circuit diagram of a power booster and ground reducing circuit in accordance with the present invention.

FIG. 3 shows an exemplary power control circuit 30 for boosting the power supply and reducing the ground supply of selected cells 14(p,q). The power control circuit 30 includes nFET devices N30–38 and pFET devices P30–35. A DELAYCLK signal and a WRCONTROL signal are provided as input signals to the power control circuit 30. The WRCONTROL signal is a write control signal provided by gating with the wordline WL(p), where the WRCONTROL signal is "High" for write operations and standby mode, and WRCONTROL is "Low" for read operations. The DELAYCLK signal may be provided by a delayed clock or by the wordline WL(p), such as by passing the wordline WL(p) and a control signal, such as a write control signal, through a logical "AND" gate. For example, a local clock generated from a global clock may function as the delayed clock. The amount of delay is preferably similar to a delay associated with wordline triggering.

SLIN is provided to the power control circuit 30 as an input supply voltage. SLIN may be provided by a power supply specifically provided for supplying SLIN to the power control circuit 30, or by an existing power supply providing power to other devices. The voltage of the supply voltage SLIN may be selected to be a desired value, and is preferably selected to be Vdd, alleviating the need for dual power supplies.

An output supply voltage SLOUT is output from the power control circuit. When the WRCONTROL signal is "High", SLOUT is Vdd (where SLIN is Vdd). When the WRCONTROL is "Low", SLOUT is Vdd (1+α).

The operation of the power control circuit 30 will now be discussed. The DELAYCLK signal acts as a trigger. During a write operation or standby mode, the WRCONTROL signal is complemented at node a and node b goes "High". NFET device N31 turns on and pulls node c down. This turns on pFET device P34, which pre-charges the output node g and outputs SLOUT as SLIN (Vdd). Thus, during a write operation or standby mode the power voltage output by the power control circuit 30 is Vdd, where SLIN is Vdd.

During a read operation, the WRCONTROL signal is "High". The WRCONTROL signal is complemented at node a, after which it is gated by the DELAYCLK signal to provide a voltage at node b which remains "Low". The signal at node b is complemented and node c is pulled up, which turns on nFET device N35. A drain capacitance of nFET device N36 and a gate capacitance of nFET device N37 is charged above the supply voltage SLIN. SLIN is supplied to the source nodes of nFET devices N36 and N37, which substantially prevents charge leakage.

The gate voltage of nFET device N37 exceeds the source voltage, which is at the input supply voltage, SUN, where SUN has a voltage of Vdd. The source of N34 at node e is charged to a value higher than Vdd. Since the outer rails of node e (i.e. the sources of pFET device P34 and nFET device N37) are maintained at Vdd, the charge from node e is distributed to output node g until one Vt drop across nodes d and e is reached. Thus, the charge on the output node g output as SLOUT is boosted above supply input voltage SLIN by an amount αVdd, where α is a predetermined value, determined by the width of the nFET devices N34 and N37 and pFET device P34. The output nFET device N38 holds the charge through its drain during the read mode.

A ground control circuit, which is the same as the power control circuit 30, is used for reducing the ground supply. A negative supply voltage −SLIN is provided, and the output is tapped at a node f. For SLIN=−Vdd, the output of the power control circuit is −αVdd. −SLIN may be chosen to be a negative voltage or "0". For −SLIN=0, a dual power supply is not needed. For SLOUT=0, nFET device N38 turns off and pFET device P35 turns on, reducing a charge on node f significantly. Since the node f is pulled down strongly, the voltage on node f goes down.

FIGS. 4–9 show results for simulation tests performed with SRAM cells of 0.17 um, 1.5 V PD SOI technology using Leff (nfet) of 0.08 ums, and Leff (pfet) of 0.10 um, where the of voltage levels of PL and SL are 1.7 V and −0.2 V, respectively.

Figure 4:
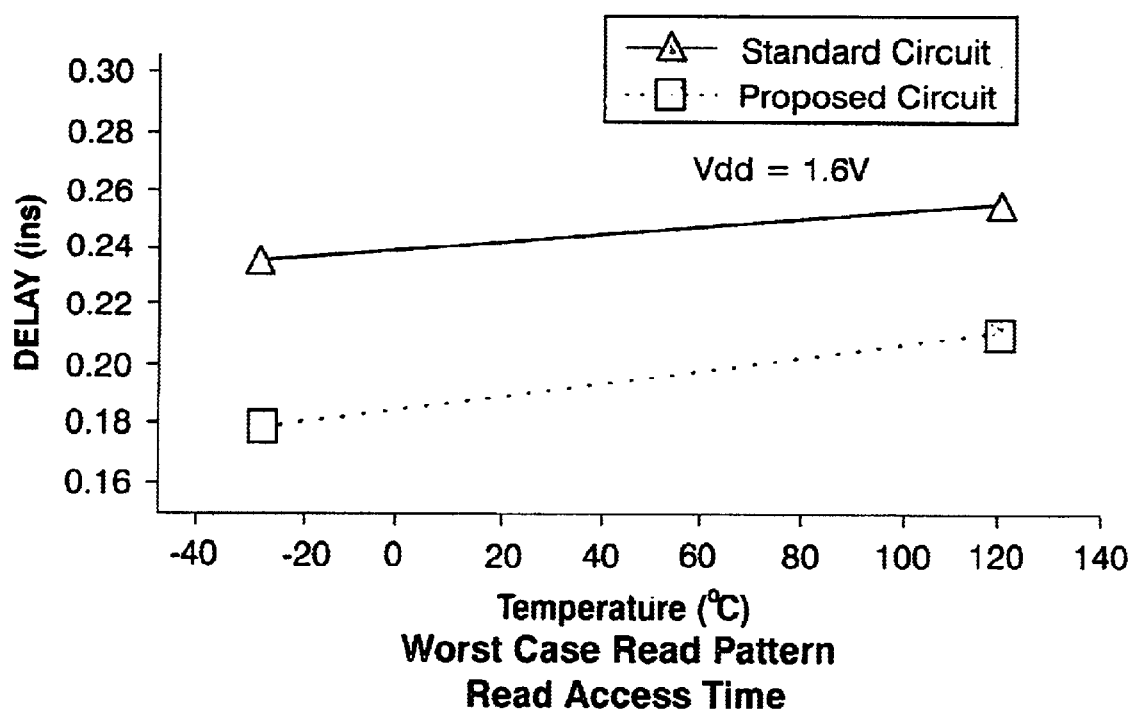
FIG. 4 is a graph plotting read access time versus temperature for a standard circuit compared to the SRAM cell of the present invention, in a worst case read pattern.

FIG. 4 is a graph plotting a comparison of the cell read access times using worst case read patterns for a standard SRAM cell, having standard power and ground supplies, and an SRAM cell having variable power and ground supplies in accordance with the present invention. The access times are measured from activation of the wordline WL(p) to an output of the sense amplifier, and scaled to bit differentials of standard circuits (i.e., standard power and ground supplies), measured at 50% of a sense amplifier enable (SAE) signal. In the SRAM cell of the present invention having variable power and ground supplies, the read current is increased and performance is improved by 18% at higher temperatures and by 24% at lower temperatures.

Figure 5:
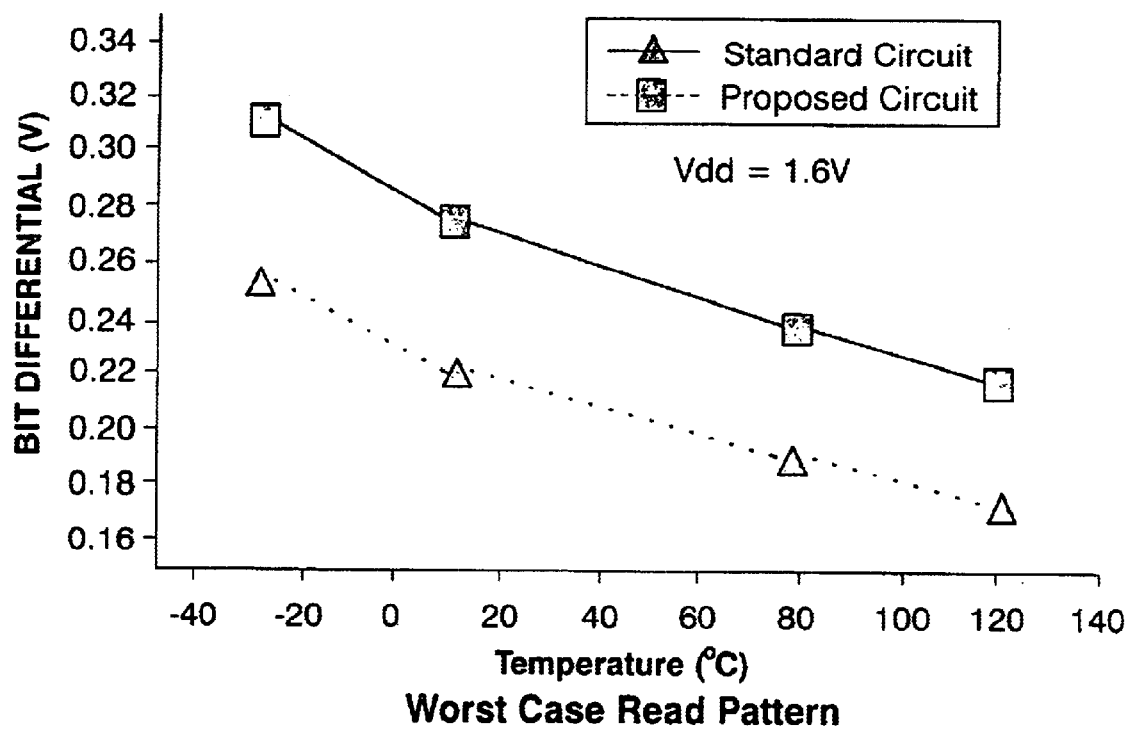
FIG. 5 is a graph plotting bit differentials versus temperature for a standard circuit compared to the SRAM cell in accordance with the present invention, in a worst case read pattern.

FIG. 5 shows a comparison of bitline differentials voltages at the 50% point of the sense amplifier enable signal using worst case read patterns. In the SRAM cell having variable power and ground supplies, substantial differentials, such as larger than 220 mV, can be achieved, even at higher temperatures. However, in the SRAM cell of the present invention having standard power and ground supply (standard circuits) substantial degradation is shown.

FIG. 6 shows a comparison of the cell read access times using best case read patterns for parasitic bipolar effects, where all the unselected cells on the same bitline are in the same state as that of the selected cells. The percentage gain in performance is slightly higher than the worst case shown in FIG. 4 due to a smaller contribution of bipolar current.

FIG. 7 shows results similar to the results for the worst case read patterns shown in FIG. 5, of behavior for the bit differentials using the best case read patterns.

Figure 8:
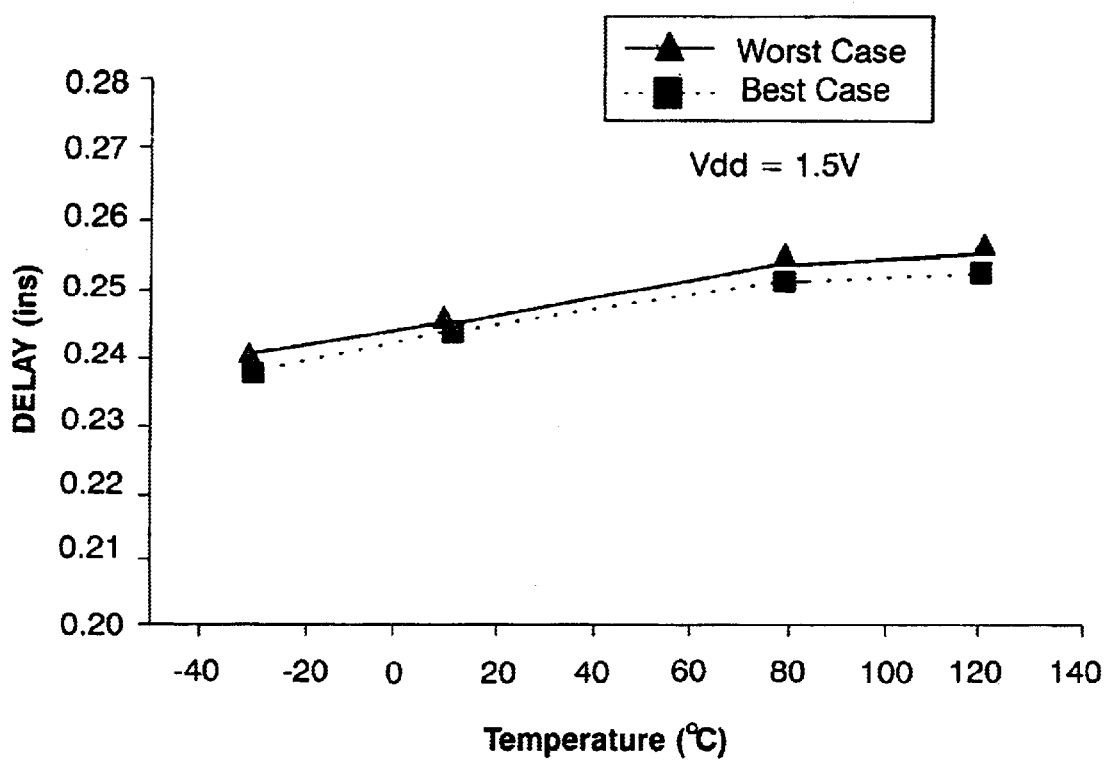
FIG. 8 is a graph plotting write access time versus temperature for the circuit of the SRAM cell of the present invention in best and worst case write patterns.

FIG. 8 shows a comparison of write access times for the SRAM cell having the variable power and ground supplies of the present invention and the standard SRAM cell. The write access times for both SRAM cells are very similar since the cell supply voltages are brought to standard Vdd and gnd voltage levels during write operations. Since this is a write through design, (i.e., for data that is written to a cell, the same data is read out simultaneously) the bit differentials for write operations (best or worst case patterns) are over 500 mV and do not gate performance.

Figure 9:
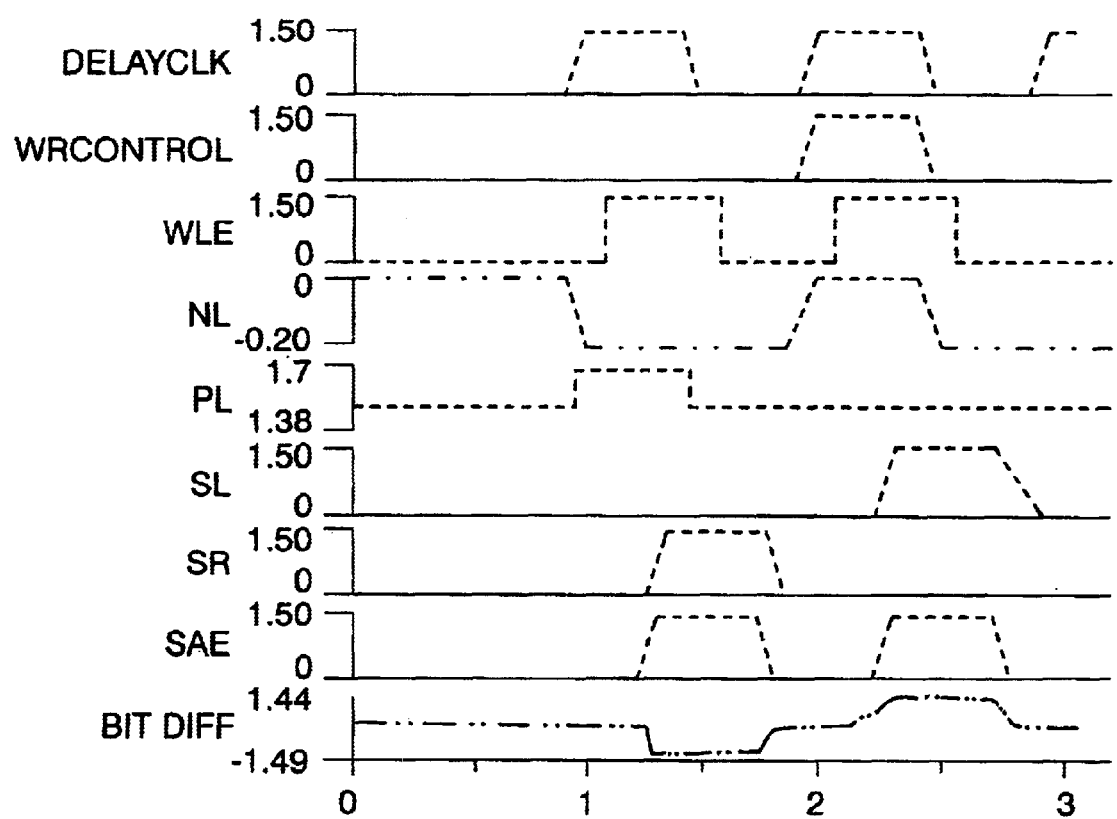
FIG. 9 is a waveform diagram for waveforms produced during functioning of the SRAM cell in accordance with the present invention.

FIG. 9 shows waveforms using the SRAM cell having variable power and ground supplies of the present invention, indicating the functionality of the SRAM cell for the first read and then write operation, where sense left (SL) and sense right (SR) outputs are dynamic outputs. Suppression of bipolar current improves the cell stability as well.

Figure 10:
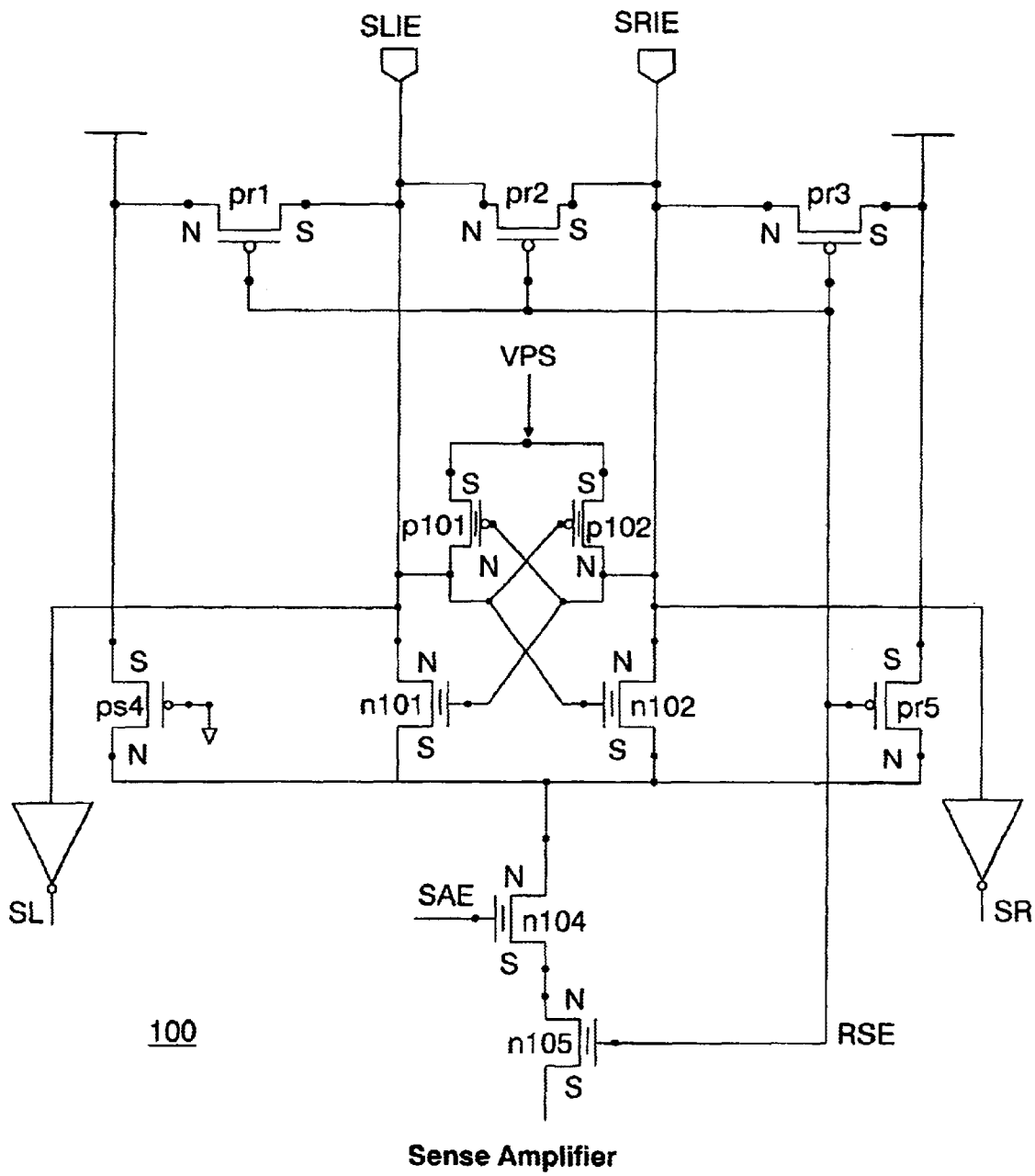
FIG. 10 is a circuit diagram of a sense amplifier circuit having a varying power supply in accordance with the present invention.

Thus, providing the SRAM cell with the variable power and ground supplies reduces read disturbance caused by parasitic bipolar currents in PD SOI technology and provides larger bitline differentials relative to SRAM cells having standard power and ground supplies, with an improvement in performance of more than 18%. FIG. 10 shows a circuit for an exemplary sense amplifier 100, where VPS is a varying power supply. The sense amplifier circuit 100 includes cross-coupled NFET devices n101, n102, connected with cross-coupled pFET devices p101, p102, pFET devices pr1, pr2, pr3, ps4, pr5, which are a pre-charge devices, and nFETs n104, n105. Inputs to the sense amplifier circuit 100 include a reset sense enable (RSE) signal, an SAE signal, a sense left input enable (SLIE) signal which is propagated along a left bitline, a sense right input enable (SRIE) signal which is propagated along a right bitline. The outputs from the sense amplifier circuit 100 include an SR signal and an SL signal. The sources of pFETs p101 and p102 are connected to the varying power supply VPS.

Preferably, SLOUT, generated by the power control circuit 30 of FIG. 3, is provided as VPS. Preferably, VPS is a pulsating power supply, where the voltage of SLOUT is varied to a selected power voltage (i.e., Vdd(1+α)) during operation of the sense amplifier in read and write modes, and remains at standard power voltage, such as Vdd, during standby mode.

Also, to reduce power consumption of the sense amplifier 100, the voltage of VPS can be reduced during active mode. Preferably the sources and drains of the FET devices of the sense amplifier circuit 100 are shared sources S and normal drains N, respectively.

The power voltage of VPS is a selected power voltage when the sense amplifier is operated in a selected mode, such as read or write, and the power voltage of VPS is a standard power voltage when the sense amplifier is operating in a non-selected mode, such as standby. The exemplary selected power voltage shown is Vdd(1+α). The exemplary standard power voltage is shown as standard Vdd.

The selected power voltage is selected to vary relative to the standard power voltage. The standard power voltage and selected power voltage may be provided by first and second power supplies, respectively. The first or second power supplies may be provided by an external or an on-chip power supply and/or a combination of one or more control circuits. For example, a control circuit may include an NFET for reducing an input to the control circuit by the Vt of the nFET.

Figure 11:
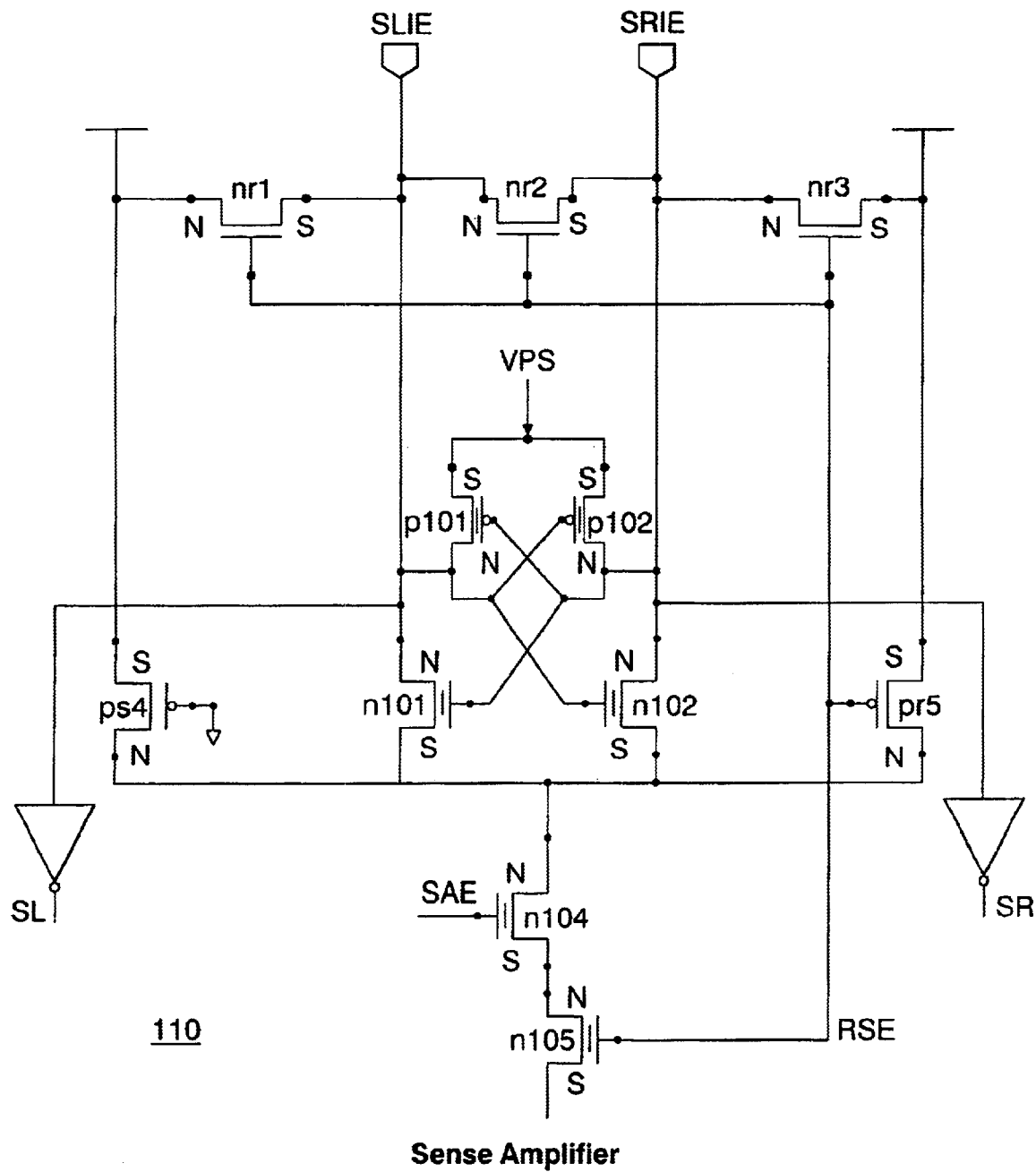
FIG. 11 is a circuit diagram of a preferred embodiment of a sense amplifier circuit having a varying power supply in accordance with the present invention.

FIG. 11 shows a preferred embodiment sense amplifier circuit 110. Preferred sense amplifier circuit 110 is the same as sense amplifier circuit 100, except that pre-charge pFET devices pr1, pr2, pr3 are replaced by NFET devices nr1, nr2, nr3, respectively. In the preferred embodiment sense amplifier circuit 110 the left and/or right bitlines are pre-charged at a lower Vdd, such as, Vdd-Vt, where Vt is the threshold voltage of at least one of the nFET devices nr1–nr3, thus reducing power consumption. Furthermore, leakage from an unselected memory cell associated with the preferred sense amplifier circuit 110 is reduced as body voltages of pass transistor(s) in the unselected memory cell are reduced by Vt. The sense amplifier circuit 110 may operate with a varying power supply VPS or a fixed power supply.

Figure 12:
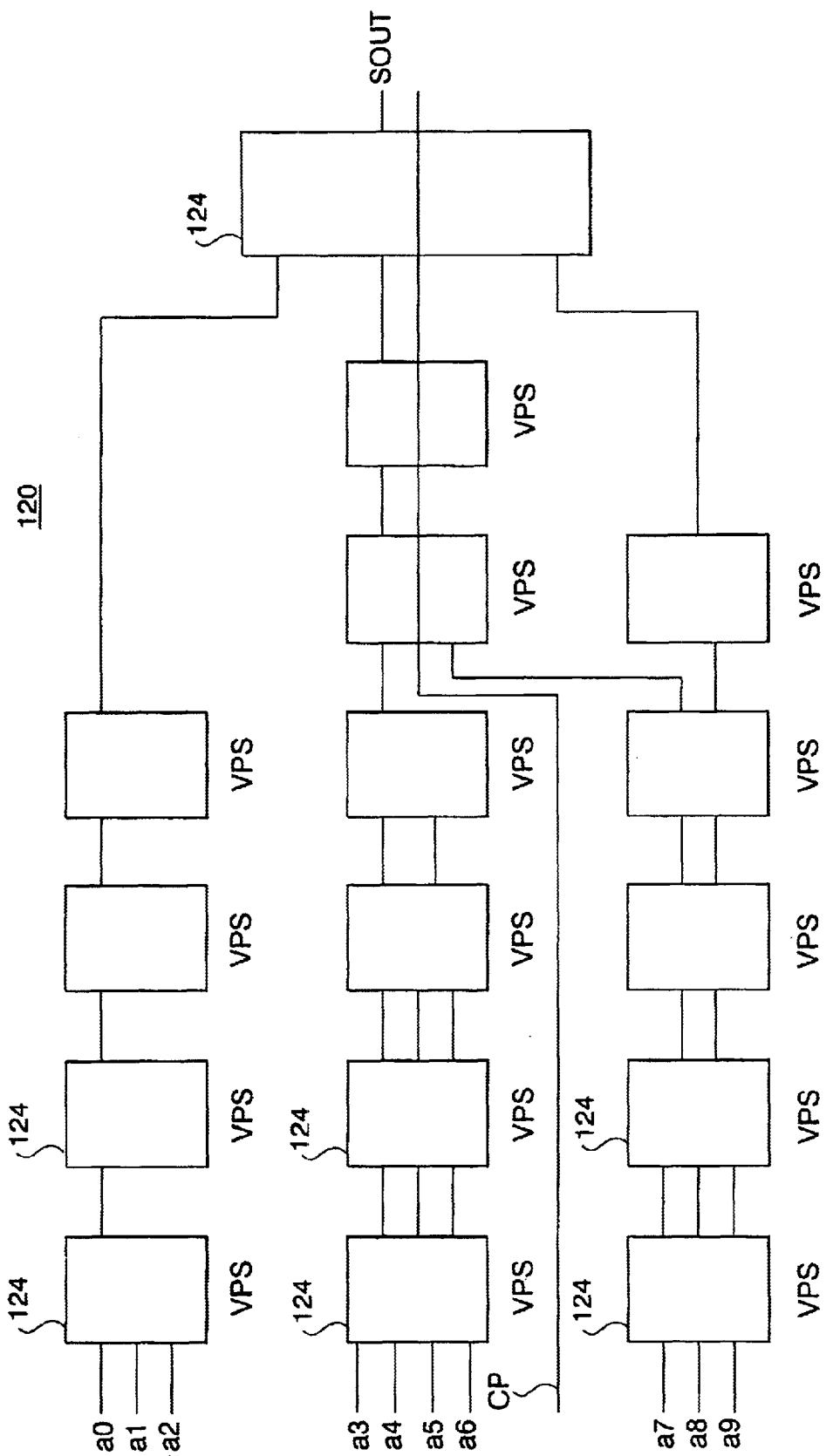
FIG. 12 is a block diagram of a logic circuit having a varying power supply for logic gates of a critical path of the logic circuit in accordance with the present invention.

FIG. 12 shows a logic circuit 120 including a plurality of logic gates 124. Input signals a0–a9 are input into the logic circuit 120 and output signal SOUT is output from the logic circuit 120. Several non-critical paths are shown in solid lines. A variable power supply VPS is provided to each gate 124. The VPS supplied to the gates 124 of the non-critical paths has a first power voltage, and the VPS supplied to gates 124 of the critical path has a second power voltage.

The VPS of the critical path (CP) is pulsed between the first power voltage during active mode and the second power voltage during standby mode. VPS of the non-critical path is held at a steady voltage, i.e. standard Vdd, or alternatively to a voltage below Vdd for preventing leakage of current. The differential between the VPS of the critical path power supply and the VPS of the non-critical path Vdd is determined for increasing the speed of signal(s) traversing the critical path, and preferably increasing the speed of signal(s) traversing the critical path to be substantially the same as the speed of signal(s) traversing the non-critical path. Preferably, VPS is provided by the power control circuit 30 of FIG. 3, where VPS is SLOUT and the first power voltage is Vdd(1+α), and the second power voltage is Vdd.

The first power voltage is selected to vary relative to the second power voltage. The first and second power voltages may be provided by first and second power supplies, respectively. The first or second power supplies may be provided by an external or an on-chip power supply and/or a combination of one or more control circuits. For example, a control circuit may include an NFET for reducing an input to the control circuit by the Vt of the NFET.

What has been described herein is merely illustrative of the application of the principles of the present invention. For example, the systems described above and implemented as the best mode for operating the present invention are for illustration purposes only. As a particular example, for instance, other design configurations may be used for the SRAM cell, sense amplifier or the power and ground control circuits which provide similar operation as the system described herein. In other words, other arrangements and methods may be implemented by those skilled in the art and are contemplated to within the scope of the appended claims.

What is claimed is:

1. A system comprising:
   at least one circuit receiving a first power voltage and a first ground voltage; and
   a power control circuit for supplying a second power voltage and a second ground voltage to at least one selected circuit of the at least one circuit of the system, the second ground voltage being the first power voltage multiplied with a negative predetermined value,
   wherein the system is one of a memory array and a logic system, and a circuit of the at least one circuit is one of a memory cell of the memory array, a sense amplifier of the memory array and a path of the logic system.

2. The system in accordance with claim 1, wherein the at least one selected circuit is a memory cell of the memory array that is selected for one of a read operation and a write operation.

3. The system in accordance with claim 1, wherein the at least one selected circuit is a sense amplifier of the memory array operating in one of a read mode and a write mode.

4. The system in accordance with claim 1, wherein the at least one selected circuit is a sense amplifier of the memory array operating in an active mode;
   and wherein the second power voltage is lower relative to the first power voltage.

5. The system in accordance with claim 1, wherein the memory array is an SRAM array and the memory cell of the at least one circuit is an SRAM memory cell.

6. The system in accordance with claim 1, wherein the sense amplifier of the at least one circuit is traversed by at least one bitline and the at least one bitline is pre-charged to the first power voltage minus at least a threshold voltage.

7. The system in accordance with claim 1, wherein the memory array is traversed by a plurality of wordlines, and wherein the at least one selected circuit is at least one memory cell traversed by at least one activated wordline of the plurality of wordlines.

8. The system in accordance with claim 1, wherein the second power voltage equals the first power voltage plus a predetermined value multiplied with the first power voltage.

9. The system in accordance with claim 1, wherein the first power voltage is provided to the power control circuit.

10. The system in accordance with claim 1, wherein the first power voltage is lower than a standard Vdd.

11. The system in accordance with claim 1, wherein the at least one selected circuit is a critical path of the logic system.

12. The system in accordance with claim 11, wherein the first power voltage is supplied to the critical path during standby mode and the second power voltage is supplied to the critical path during active mode.

13. The system in accordance with claim 1, wherein the at least one circuit receives a first ground voltage, and wherein the power control circuit supplies a second ground voltage to the at least one selected circuit of the at least one circuit.

14. The system in accordance with claim 13, wherein a clock signal is provided to the power control circuit for triggering the power control circuit to output at least one of the second power voltage and the second ground voltage.

15. A method for providing a power supply voltage to a system including one of a memory array and a logic system, the system having at least one circuit, the at least one circuit including one of a memory cell of the memory array, a sense amplifier of the memory array and a path of the logic system, the method comprising the steps of:
   providing a first power supply voltage to the at least one circuit of the system;
   providing a first ground supply voltage to the at least one circuit of the system;
   selecting at least one circuit of the at least one circuit;
   providing a second power supply voltage to at least one selected circuit of the system; and
   providing a second ground supply voltage to the at least one selected circuit after multiplying the first power supply voltage by a negative predetermined value to create the second ground supply voltage.

16. The method in accordance with claim 15, further comprising the steps of:
   providing a first ground supply voltage to the at least one circuit of the system; and
   providing a second ground supply voltage to the at least one selected circuit.

17. The method in accordance with claim 15, wherein the step of providing a second power supply voltage includes the steps of:

multiplying the first power supply voltage by a predetermined value to obtain a product voltage; and summing the product voltage with the first power supply voltage.

18. An SRAM system having an array of SRAM cells receiving a first power voltage and a first ground voltage, the SRAM system comprising;

a power control circuit for supplying a second power voltage and a second ground voltage to at least one selected SRAM cell of the array of SRAM cells.

19. The SRAM system in accordance with claim 18, wherein the array of SRAM cells is traversed by a plurality of wordlines, and wherein the at least one selected SRAM cell is traversed by at least one activated wordline of the plurality of wordlines.

20. The SRAM system in accordance with claim 19, wherein the power control circuit includes a wordline power control circuit associated with a wordline of the plurality of wordlines, and wherein the wordline provides a signal to the wordline power control circuit in accordance with an activated state of the wordline.

21. The SRAM system in accordance with claim 19, wherein the at least one wordline is activated for a read operation.

22. The SRAM system in accordance with claim 19, wherein the power control circuit further includes a wordline ground control circuit associated with a wordline of the plurality of wordlines, and wherein the wordline provides a signal to the wordline ground control circuit in accordance with an activated state of the wordline.

23. The SRAM system in accordance with claim 22, wherein the first power voltage is inverted and supplied to the wordline ground control circuit as the first ground voltage.

24. The SRAM system in accordance with claim 18, wherein the first power voltage is provided to the power control circuit.

25. The SRAM system in accordance with claim 18, wherein a clock signal is provided to the power control circuit for triggering the power control circuit to output at least one of the second power voltage and the second ground voltage.

26. A method for providing a power supply voltage to SRAM cells of an SRAM array comprising the steps of:

providing a first power supply voltage to the SRAM cells of the SRAM array;

providing a first ground supply voltage to the SRAM cells of the SRAM array;

selecting at least one SRAM cell of the SRAM array;

providing a second power supply voltage to the at least one selected SRAM cell; and providing a second ground supply voltage to the at least one selected SRAM cell.

27. The method in accordance with claim 26, wherein the step of selecting includes the step of activating a wordline traversing the at least one selected SRAM cell.

28. The method in accordance with claim 26, wherein the step of providing a second power supply voltage includes the steps of:

providing a wordline power control circuit associated with a wordline of at least one wordline traversing the selected at least one SRAM cell;

providing the first power supply voltage to the wordline power control circuit;

increasing the first power supply voltage; and outputting the increased first power supply voltage as the second power supply voltage.

29. The method in accordance with claim 26, wherein the step of providing a second ground supply voltage includes the steps of:

providing a wordline ground control circuit associated with a wordline of at least one wordline traversing the selected at least one SRAM cell;

providing the first ground supply voltage to the wordline ground control circuit;

decreasing the first ground supply voltage; and outputting the decreased first ground supply voltage as the second ground supply voltage.

30. The method in accordance with claim 26, wherein the step of providing the second ground voltage includes the steps of:

providing a wordline ground control circuit associated with a wordline of at least one wordline traversing the selected at least one SRAM cell;

inverting the first power supply voltage;

providing the inverted power supply voltage to the wordline ground control circuit;

decreasing the inverted first power supply voltage; and outputting the decreased inverted first power supply voltage as the second ground voltage.

* * * * *